| United States Patent [19] | | [11] 3,997,379 |
|---|---|---|
| Rosnowski | | [45] Dec. 14, 1976 |

[54] DIFFUSION OF CONDUCTIVITY MODIFIERS INTO A SEMICONDUCTOR BODY

[75] Inventor: Wojciech Rosnowski, Summit, N.J.

[73] Assignee: RCA Corporation, New York, N.Y.

[22] Filed: June 20, 1975

[21] Appl. No.: 588,863

[52] U.S. Cl. .............................. 148/189; 148/186; 148/187

[51] Int. Cl.$^2$ ...................................... H01L 21/223

[58] Field of Search ................... 148/189, 186, 187

[56] References Cited

UNITED STATES PATENTS

| 3,589,953 | 6/1971 | Traxler | 148/189 |
|---|---|---|---|
| 3,658,606 | 4/1972 | Lyons et al. | 148/187 |
| 3,725,145 | 4/1973 | Maki | 148/189 X |
| 3,752,711 | 8/1973 | Kooi et al. | 148/189 X |

*Primary Examiner*—G. Ozaki
*Attorney, Agent, or Firm*—H. Christoffersen; R. P. Williams; R. A. Hays

[57] ABSTRACT

A method of diffusing conductivity modifiers into a semiconductor body is disclosed. The method employs an open system operated under a relatively high vacuum. A silicon alloy serves as the source of conductivity modifiers. Control of the dopant vapor pressure during diffusion is provided by controlling the composition of the silicon alloy. Additional control of the diffusion is provided by controlling the temperature of the system during diffusion and by regulating the vacuum drawn during diffusion.

3 Claims, No Drawings

DIFFUSION OF CONDUCTIVITY MODIFIERS INTO A SEMICONDUCTOR BODY

The present invention relates generally to a method of diffusing conductivity modifiers into a semi-conductor body. More particularly it relates to a method of introducing aluminum conductivity modifiers into a silicon body.

One conventional method of introducing aluminum impurities into a silicon body is to place the source of conductivity modifiers and the silicon bodies to be doped in a sealed ampule. The ampule is then heated to a temperature at which diffusion occurs. There is little control of the surface concentration of conductivity modifiers during the time of the actual diffusion process. That is, once the diffusion temperature has been reached the only control the operator of the system has is the variability of the diffusion temperature. A second drawback of this method is that the ampules are generally sealed in an atmosphere of an inert gas, for example, argon. The presence of the inert gas reduces the surface concentration achievable. This is because the system is limited in the amount of aluminum partial pressure attainable in the presence of the partial pressure generated by the inert gas.

Another conventional method employs an open tube system under vacuum. In this method the source of conductivity modifiers and the silicon body to be doped are placed in a tube, generally made of quartz, which is sealed on one end and open on the other end. The source is placed nearest to the sealed end and the silicon body is placed between the source and the open end. A vacuum is drawn at the open end of the tube. Conventional sources employed in this type of system generally have a vaporization rate which is different than the rate of diffusion of the impurity into silicon. Thus it is not uncommon to heat the source to its vaporization temperature and, using a separate heater, heat the silicon body to its diffusion temperature.

The present method may be generally described in a framework having four basic topics. The topics are: 1) the source of conductivity modifiers; 2) the loading and evacuation of a diffusion tube; 3) the heating of the system; and 4) the actual diffusion of conductivity modifiers into a silicon body. A detailed description of each of these topics will be presented below. The source of conductivity modifiers will be discussed first.

In the present method, the source of conductivity modifiers may be an alloy of silicon. The alloy may also comprise aluminum or gallium, however, aluminum is preferred. The term alloy as used herein is intended to means a substance the structure of which is defined by its composition which can vary widely. The physical properties may also vary within a relatively wide range. This is different from a chemical compound which involves a constant relation among the atoms of the elements forming the compound. Thus the physical properties of chemical compounds relate to the non-variable constant which is in its structure.

The composition of an alloy is dependent upon, among other factors, the temperature at which it is formed. For example, if an aluminum-silicon alloy is formed at about 577° C the composition thereof will be about 11% silicon and about 89% aluminum. Alternatively, if an aluminum-silicon alloy is formed at about 1000° C, it will have a composition of about 95% silicon and about 5% aluminum.

For relatively efficient diffusion, it is desirable to have a relatively low aluminum partial pressure during the diffusion. The aluminum partial presssure is that portion of the total pressure attributable to the aluminum vapor released by the source of conductivity modifiers. The reason for the relatively low aluminum partial pressure is that relatively high partial pressure can result in a condensed layer of aluminum on a surface of the silicon body. This condensation layer will alloy with the silicon and reduce the rate of diffusion of the aluminum into the silicon body. It is therefore desirable that the aluminum partial pressure be such that the rate of aluminum diffusion is comparable to or greater than the rate of aluminum condensation.

The aluminum partial pressure is directly related to the composition of the aluminum-silicon alloy; that is, the greater the aluminum content of the alloy, the greater the aluminum partial pressure during diffusion. The present method controls the aluminum partial pressure by selection of the temperature at which the aluminum-silicon alloy is formed. Preferably, the aluminum-silicon alloy is formed at a temperature of about 1000° C. As described above the alloy is then comprised of about 95% silicon and about 5% aluminum.

The source of conductivity modifiers and the silicon body in which a diffused region is to be formed are then loaded into a diffusion tube. Preferably, this is a quartz tube which is sealed at one end and open at the other end. The source of conductivity modifiers is placed nearer to the sealed end than is the silicon body. If the aluminum-silicon alloy has not been previously formed, the aluminum and silicon components thereof are loaded individually but in intimate contact. A vacuum source may be connected to the open end of the diffusion tube. Preferably, the vacuum source is one which is capable of drawing a relatively high vacuum, for example on the order of about $10^{-5}$ torr or lower. The diffusion tube is then evacuated.

If the aluminum-silicon alloy has not been previously formed, the diffusion tube is heated to a temperature at which alloying will occur. Preferably, this would be at about 1,000° C, and the heat treatment is carried out at this alloying temperature until the alloying is complete for example on the order of about an hour. Preferably during this particular alloying process, the vacuum system is in operation but, because of the relatively low temperature, the diffusion of aluminum into the silicon body is negligible.

After the aluminum-silicon alloy has been formed in this example, the temperature is increased to about 1200° C where the significant diffusion of aluminum atoms occurs. Under the above conditions, the rate of diffusion into the silicon body of aluminum will be greater than the rate of condensation of the aluminum onto the surface. It should be noted that at this point in the process there are a number of controls over the aluminum partial pressure. The first control is the temperature at which the diffusion is occuring, i.e., in this case on the order of between from about 1100° C to about 1200° C. If the diffusion temperature is increased, the partial pressure of aluminum is increased. Further control is available by varying the amount of vacuum drawn. The rate of diffusion of the aluminum vapor on the silicon body is determined partially by the amount of vacuum drawn; that is, the higher the vacuum drawn, the higher the rate of aluminum impingement on the surface. Again it is desirable to have the vacuum drawn in combination with the other factors, at such a value that the aluminum diffuses into the silicon body at a rate higher than the rate of condensation of aluminum on the surface.

Since aluminum diffuses deeper into silicon than boron, for example, for the same time and the same temperature, the formation of a deep pocket of aluminum atoms will take less time than if boron atoms were used. The diffusion rate of aluminum mentioned above is on the order of about 2½ times greater than that of boron.

This method results in a surface concentration of aluminum on the order of about $10^{19}$ atoms per centimeter$^3$ compared to a relatively low surface carrier concentration on the order of about $10^{17}$ atoms per centimeter$^3$ obtainable by prior art methods. The use of aluminum as a dopant in a silicon body 10 is for many applications relatively much better than boron, for example, because aluminum does not disturb the crystal structure as much as boron; that is, aluminum has a better lattice match to the silicon. Aluminum has a lattice mismatch with silicon on the order of about 7.7% while boron has a lattice mismatch on the order of about 25%. Hence, aluminum will cause fewer atomic dislocations and reduce the number of other crystal imperfections and therefore improve the overall device quality.

What is claimed is:
1. A method of introducing conductivity modifiers into a semiconductor body which comprises:
   forming, at a first temperature, in a diffusion tube having one end sealed and having a vacuum system connected to the other end, a source of said conductivity modifiers, said source being an aluminum or gallium alloy of silicon, said diffusion tube further containing said semiconductor body; and
   heating said diffusion tube, to a second temperature, said second temperature being comparatively higher than said first temperature, at which said conductivity modifiers are emitted from said source and diffuse into said semiconductor body.
2. A method as claimed in claim 1 wherein:
   said forming step comprises heating aluminum and silicon components to an alloying temperature of about 1000° C; and
   maintaining said alloying temperature for about an hour whereby said alloy has a composition of about 95% silicon and about 5% aluminum.
3. A method as claimed in claim 1 wherein:
   said vacuum system draws a vacuum of about $10^{-5}$ torr.

* * * * *